(12) United States Patent
Wang

(10) Patent No.: US 9,761,515 B2
(45) Date of Patent: Sep. 12, 2017

(54) SUBSTRATE STRUCTURE

(71) Applicant: Subtron Technology Co., Ltd., Hsinchu County (TW)

(72) Inventor: Chao-Min Wang, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days.

(21) Appl. No.: 15/475,133

(22) Filed: Mar. 31, 2017

(65) Prior Publication Data

US 2017/0207156 A1 Jul. 20, 2017

Related U.S. Application Data

(62) Division of application No. 15/052,885, filed on Feb. 25, 2016, now Pat. No. 9,648,760, which is a division (Continued)

(30) Foreign Application Priority Data

Apr. 28, 2014 (TW) .............................. 103115196 A

(51) Int. Cl.
*H01L 23/498* (2006.01)
*H01L 23/13* (2006.01)
(Continued)

(52) U.S. Cl.
CPC .... *H01L 23/49822* (2013.01); *H01L 21/4857* (2013.01); *H01L 21/6835* (2013.01);
(Continued)

(58) Field of Classification Search
None
See application file for complete search history.

(56) References Cited

U.S. PATENT DOCUMENTS

2007/0124924 A1 6/2007 Nakamura
2011/0097851 A1 4/2011 Hsu
(Continued)

FOREIGN PATENT DOCUMENTS

TW 200950038 12/2009
TW 201244578 11/2012

OTHER PUBLICATIONS

"Office Action of China Counterpart Application," dated May 15, 2017, p. 1-p. 10.

*Primary Examiner* — Asok K Sarkar
(74) *Attorney, Agent, or Firm* — Jianq Chyun IP Office

(57) ABSTRACT

A substrate structure includes a dielectric layer, a metal foil, a patterned metal layer, a first patterned solder-resist layer, a release layer and a second patterned solder-resist layer. The dielectric layer includes a first surface having a plurality of recesses and a second surface. The metal foil is disposed on the second surface. The patterned metal layer is disposed on the first surface, the patterned metal layer has a plurality of openings, and the openings are respectively corresponding to and expose the recesses. The first patterned solder-resist layer is filled in each of the recesses and corresponding to each of the openings. A top surface of the first patterned solder-resist layer is substantially coplanar with a top surface of the patterned metal layer. The second patterned solder-resist layer is disposed on the first patterned solder-resist layer and in the openings, and covers a portion of the patterned metal layer.

7 Claims, 9 Drawing Sheets

Related U.S. Application Data of application No. 14/447,575, filed on Jul. 30, 2014, now Pat. No. 9,313,886.

(51) Int. Cl.
*H01L 21/48* (2006.01)
*H01L 21/683* (2006.01)

(52) U.S. Cl.
CPC ........ *H01L 23/13* (2013.01); *H01L 23/49838* (2013.01); *H01L 23/49866* (2013.01); *H01L 2221/68345* (2013.01); *H01L 2221/68381* (2013.01)

(56) References Cited

U.S. PATENT DOCUMENTS

| | | | | |
|---|---|---|---|---|
| 2011/0297423 | A1* | 12/2011 | Noh | H05K 3/4007 174/250 |
| 2012/0305390 | A1* | 12/2012 | Fredenberg | B81C 99/0085 204/290.03 |
| 2013/0183800 | A1* | 7/2013 | Hsu | H01L 23/49822 438/118 |
| 2015/0084907 | A1* | 3/2015 | Burberry | G06F 3/046 345/174 |
| 2015/0173185 | A1* | 6/2015 | Ito | H05K 3/38 174/262 |
| 2016/0044780 | A1* | 2/2016 | Inagaki | H05K 1/0296 174/251 |

\* cited by examiner

SUBSTRATE STRUCTURE

CROSS-REFERENCE TO RELATED APPLICATION

This application is a divisional application of and claims the priority benefit of U.S. application Ser. No. 15/052,885, filed on Feb. 25, 2016, now allowed. The prior application Ser. No. 15/052,885 is a divisional application of U.S. application Ser. No. 14/447,575, filed on Jul. 30, 2014, now issued as U.S. Pat. No. 9,313,886, which claims the priority benefit of Taiwan application serial no. 103115196, filed on Apr. 28, 2014. The entirety of each of the above-mentioned patent applications is hereby incorporated by reference herein and made a part of specification.

BACKGROUND OF THE INVENTION

Field of the Invention

The invention relates to a substrate structure. More particularly, the invention relates to a substrate structure having a smaller overall thickness.

Description of Related Art

The purpose of chip packages is to protect exposed chips, to reduce contact density in a chip, and to provide good thermal dissipation for chips. In a common packaging method, the chip is installed onto a package carrier by wire bonding or by flip chip bonding, such that the contacts on the chip may be electrically connected to the package substrate. Therefore, the contacts on the chip may be re-distributed through a package substrate, so as to comply with contact distribution of external devices of next hierarchy.

Generally, the manufacture of the package substrate is performed as follows. A core layer is used as a core material, and patterned circuit layers and patterned dielectric layers are alternately stacked on the core dielectric layer by performing a fully additive process, a semi-additive process, a subtractive process, or any other process. Consequently, the core layer accounts for a quite large proportion of the overall thickness of the package carrier. Therefore, if there is a bottleneck in reducing the thickness of the core layer, it will be very difficult to reduce the thickness of the package structure.

SUMMARY OF THE INVENTION

The substrate structure provided by the invention is a single layer structure including a separable substrate.

The manufacturing method of a substrate structure provided by the invention is used for manufacturing the above-mentioned substrate structure.

A manufacturing method of a substrate structure according to the invention includes the following steps. A substrate is provided. The substrate includes a supporting layer, two release layers and two base metal layers. The two release layers are disposed on two opposite surfaces of the supporting layer respectively. The two base metal layers cover the two release layers respectively. A patterned metal layer is formed on each of the base metal layers. Each of the patterned metal layers includes a plurality of openings to expose a corresponding portion of the base metal layer. A first patterned solder-resist layer is formed on each of the patterned metal layers to cover the exposed portion of the base metal layer. A stacking layer is laminated on each of the patterned metal layers, and each of the stacking layers covers the corresponding first patterned solder-resist layer, wherein each of the stacking layers includes a dielectric layer and a metal foil. Each of the dielectric layers is disposed between the corresponding patterned metal layer and the corresponding metal foil. Each of the base metal layers is separated from the release layer, and each of the stacking layers is located on the corresponding base metal layer. Each of the base metal layers is removed to expose each of the patterned metal layers and each of the first patterned solder-resist layers.

A substrate structure according to the invention includes a dielectric layer, a metal foil, a patterned metal layer and a first patterned solder-resist layer. The dielectric layer includes a first surface and a second surface opposite to the first surface. The first surface has a plurality of recesses. The metal foil is disposed on the second surface. The patterned metal layer is disposed on the first surface. The patterned metal layer has a plurality of openings. The openings respectively correspond to and expose the recesses. The first patterned solder-resist layer is filled into each of the recesses and the corresponding opening. A top surface of the first patterned solder-resist layer is substantially coplanar with a top surface of the patterned metal layer.

A manufacturing method of a substrate structure according to the invention includes the following steps. A substrate is provided. The substrate includes a supporting layer, two release layers and two base metal layers. The two release layers are disposed on two opposite surfaces of the supporting layer respectively. The two base metal layers cover the two release layers respectively. A first patterned solder-resist layer is formed on each of the base metal layers. A stacking layer is laminated on each of the base metal layers, and each of the stacking layers covers the corresponding first patterned solder-resist layer, wherein each of the stacking layers includes a dielectric layer and a metal foil. Each of the dielectric layers is disposed between the corresponding base metal layer and the corresponding metal foil. Each of the base metal layers is separated from the release layer, and each of the stacking layers is located on the corresponding base metal layer. Each of the base metal layers is patterned to form a patterned metal layer on the corresponding stacking layer. Each of the patterned metal layers at least partially exposes each of the first patterned solder-resist layers.

A substrate structure according to the invention includes a dielectric layer, a metal foil, a first patterned solder-resist layer and a patterned metal layer. The dielectric layer includes a first surface and a second surface opposite to the first surface. The first surface has a plurality of recesses. The metal foil is disposed on the second surface. The first patterned solder-resist layer is filled into each of the recesses. A top surface of the first patterned solder-resist layer is substantially coplanar with the first surface. The patterned metal layer is disposed on the first surface and at least partially exposes the first patterned solder-resist layer.

Based on the above, for the substrate structure of the invention, the manufacturing processes of the substrate structure are respectively performed on a separable substrate in a symmetrical manner. Accordingly, after a substrate separation is performed, two substrate structures independent from each other may be obtained, so as to effectively save the manufacturing time and improve the production efficiency. In addition, in the separable substrate of the invention, the release layer is connected between the supporting layer and the patterned metal layer of the substrate, such that after the stacking layer is formed, the supporting layer can be easily removed by taking advantage of the separability of the release layer. Therefore, compared to a conventional substrate structure which is formed by stacking a plurality of stacking layers on a core layer, the substrate structure of the invention has a smaller overall thickness, and thus a package structure using such substrate structure has a smaller package thickness.

To make the above features and advantages of the invention more comprehensible, embodiments accompanied with drawings are described in detail as follows.

DETAILED DESCRIPTION OF DISCLOSED EMBODIMENTS

The foregoing and other technical contents, features, and effects relating to the invention will be clearly shown in the following detailed description of embodiments with reference to the accompanying drawings. In the following embodiments, wordings used to indicate directions, such as "up," "down," "front," "back," "left," and "right", merely refer to directions in the accompanying drawings. Therefore, the directional wording is used to illustrate rather than limit the invention. In addition, in the following embodiments, the same or like numbers stand for the same or like elements.

Figure 1A:
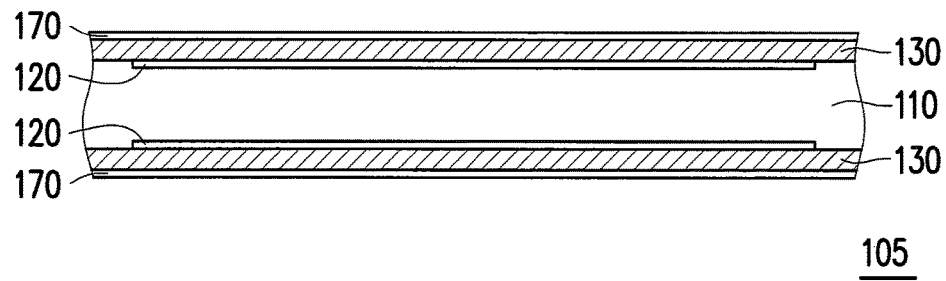
FIGS. 1A to 1G are schematic cross-sectional views illustrating a process of a manufacturing method of a substrate structure according to an embodiment of the invention.

FIGS. 1A to 1G are schematic cross-sectional views illustrating a process of a manufacturing method of a substrate structure according to an embodiment of the invention. The substrate structure of the present embodiment is a single layer structure including a separable substrate. In the present embodiment, the manufacturing method of a substrate structure includes the following steps. First, referring to FIG. 1A, a substrate 105 is provided. As shown in FIG. 1A, the substrate 105 includes a supporting layer 110, two release layers 120 and two base metal layers 130. The two release layers 120 are disposed on two opposite surfaces of the supporting layer 110 respectively. The two base metal layers 130 cover the two release layers 120 respectively. That is to say, each of the release layers 120 is located between the supporting layer 110 and the corresponding base metal layer 130. In general, the release layer 120 is a thin film with surface separability, which does not exhibit adhesiveness or only exhibits slight adhesiveness to specific materials under specific conditions. In the present embodiment, the release layer 120 is, for example, a fluorine release film, a polyethylene (PE) release film, or a polyethylene terephthalate (PET) release film, or an aluminum foil. It is for sure that the invention is not limited thereto. In addition, in the present embodiment, as shown in FIG. 1A, an etch stop layer 170 is further formed on each of the base metal layers 130. The etch stop layer 170 is, for example, a nickel layer, and is formed on each of the base metal layers 130 by electroplating.

Figure 1B:
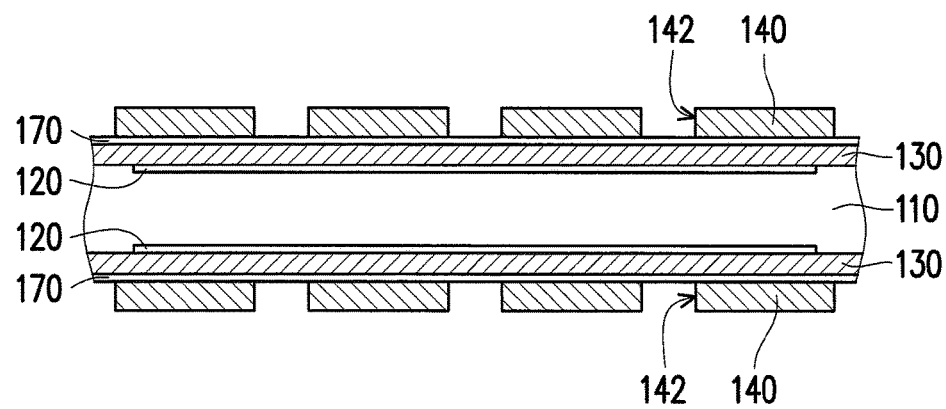

Next, referring to FIG. 1B, a patterned metal layer 140 is formed on each of the base metal layers 130. Each of the patterned metal layers 140 includes a plurality of openings 142 to partially expose the corresponding base metal layers 130. In the present embodiment, the step of forming the patterned metal layer 140 includes, for example, first forming a patterned photoresist layer on the base metal layer 130, wherein the patterned photoresist layer exposes a portion of the base metal layer 130. Next, the patterned photoresist layer functions as a mask for forming the patterned metal layer 140 on the exposed portion of the base metal layer 130 by electroplating. That is to say, the patterned metal layer 140 of the present embodiment is formed by an additive process. The patterned metal layer 140 formed by such manufacturing process easily meets the requirement of fine-pitch circuits. Moreover, when the patterned metal layer 140 is formed in this manner, the thickness of the patterned metal layer 140 may be easily controlled by the thickness of the corresponding patterned photoresist layer. Thus, a user may adjust the thickness of the substrate structure formed by such manufacturing process by controlling the thickness of the patterned metal layer 140. Of course, in other embodiments of the invention, the patterned metal layer 140 may be formed by a subtractive process, such as an etching process.

Figure 1C:
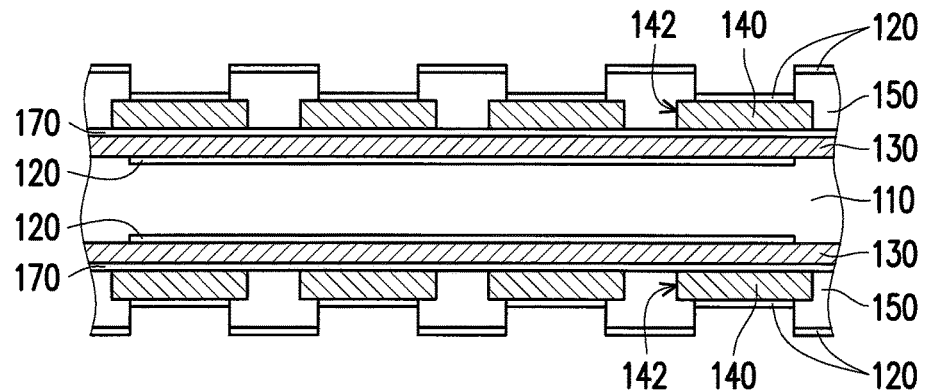
Figure 1D:
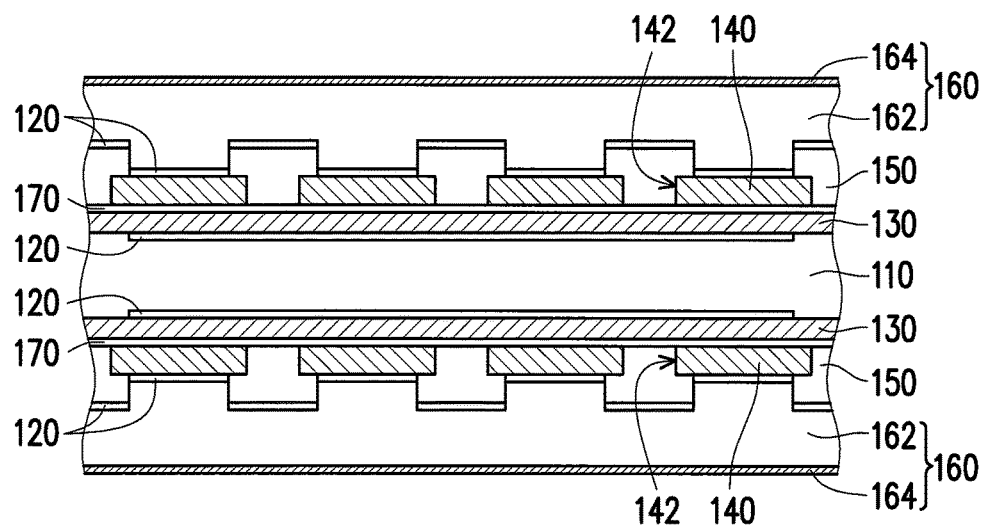

Next, referring to FIG. 1C, a first patterned solder-resist layer 150 is formed on each of the patterned metal layers 140 to cover the portion of the base metal layer 130 exposed by the opening 142. In the present embodiment, the release layer 120 further covers the patterned metal layer 140 and the first patterned solder-resist layer 150, such that the patterned metal layer 140 and the first patterned solder-resist layer 150 may be easily separated from a dielectric layer 162 that is subsequently laminated thereon. Materials of the release layer 120 include polymide (PI), polyethylene terephthalate (PET) or aluminum foil, etc. After that, as shown in FIG. 1D, a stacking layer 160 is laminated on each of the patterned metal layers 140. Each of the stacking layers 160 covers the corresponding patterned metal layer 140 and the corresponding first patterned solder-resist layer 150. In detail, each of the stacking layers 160 includes the dielectric layer 162 and a metal foil 164. Each of the stacking layers 160 is laminated on the corresponding patterned metal layer 140 by the dielectric layer 162, i.e., each of the dielectric layers 162 is located between the corresponding patterned metal layer 140 and the corresponding metal foil 164.

Figure 1E:
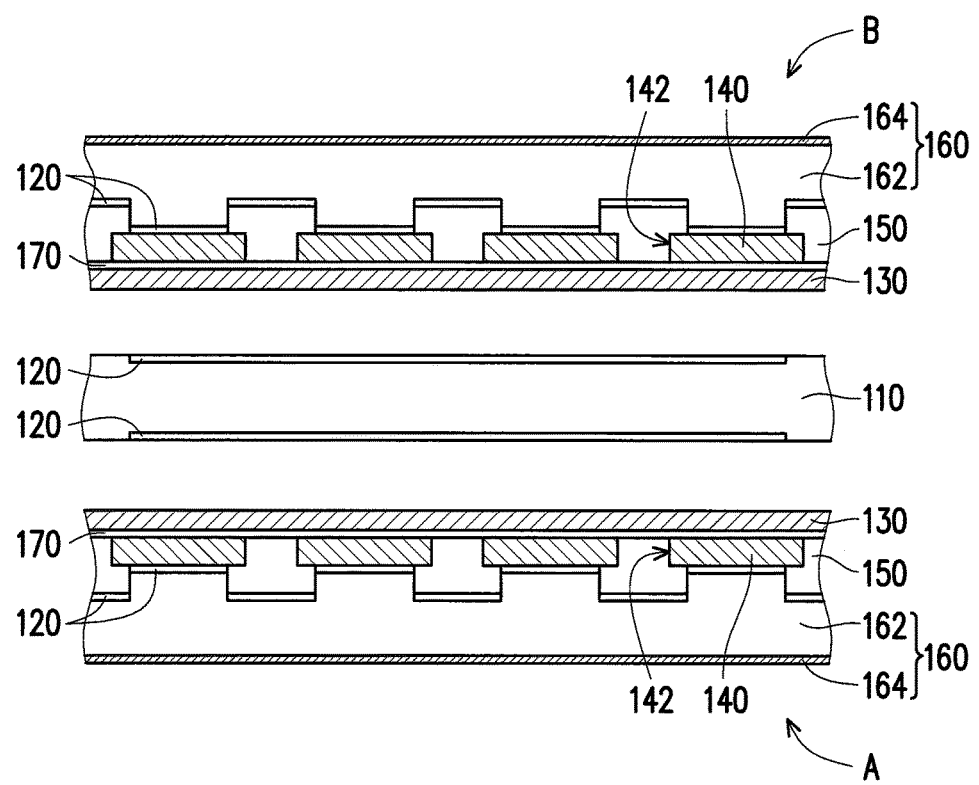

Next, referring to FIG. 1E, by adopting the separability of the release layer 120, each of the base metal layers 130 is separated from the release layer 120, so as to remove the supporting layer 110 to form two structures A and B that are independent from each other, as shown in FIG. 1E. It is to be noted that in subsequent manufacturing steps shown in of FIG. 1F to FIG. 2, the structure A is illustrated for exemplary purposes. However, it is understood by persons of ordinary skill in the art that the manufacturing process illustrated in FIG. 1F to FIG. 2 is applicable to both the structures A and B.

Figure 1F:
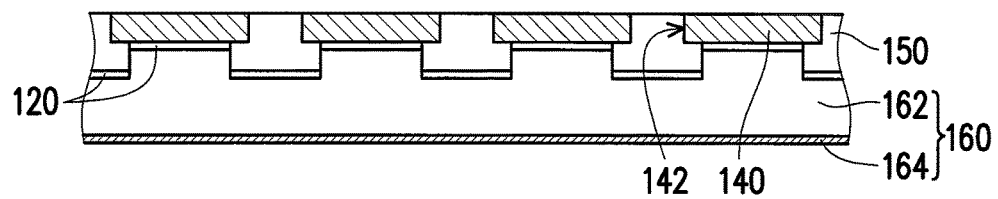

Next, the base metal layer 130 as shown in FIG. 1E is removed to expose the patterned metal layer 140 and the first patterned solder-resist layer 150, as shown in FIG. 1F. In the present embodiment, the method of removing the base metal layer 130 includes a step of using the etch stop layer 170 shown in FIG. 1E as an ending point of an etching process for removing the base metal layer 130. Then, the etch stop layer 170 is removed by, for example, a peeling process, so as to expose the patterned metal layer 140 and the first patterned solder-resist layer 150.

Figure 1G:
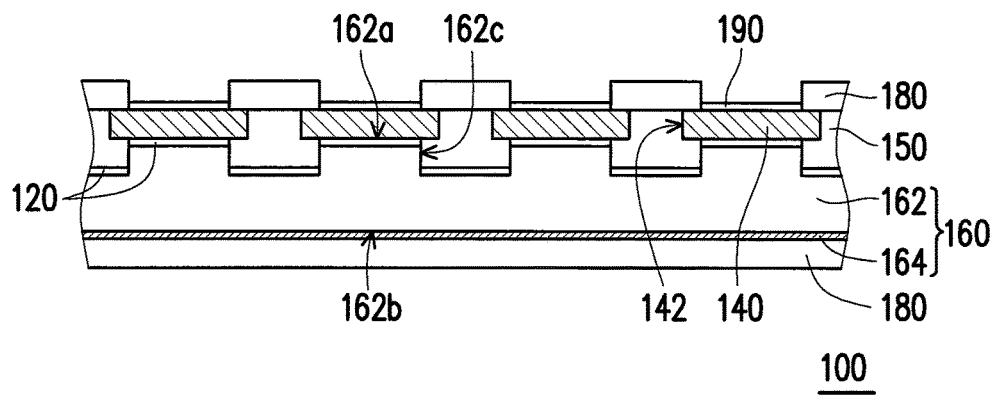

After that, as shown in FIG. 1G, a second patterned solder-resist layer 180 is formed on the first patterned solder-resist layer 150 and the metal foil 164, and the second patterned solder-resist layer 180 covers a portion of the patterned metal layer 140. Next, a surface finish layer 190 is formed on the patterned metal layer 140 to cover the portion of the patterned metal layer 140 exposed by the second patterned solder-resist layer 180. In this way, the manufacture of a substrate structure 100 can be completed. In the present embodiment, the surface finish layer 190 is an organic solderability preservatives (OSP) layer, an electroless nickel and immersion gold (ENIG) layer, an immersion silver (I-Ag) layer, an immersion tin (I-Sn) layer, an immersion bismuth (I-Bi) layer, a hot air solder leveling (HASL) layer, a nickel and gold electroplating layer, an electroless Pd/Ni layer, an electroless Pd/Cu layer, or a Sn—Bi alloy electroplating layer.

Figure 2:
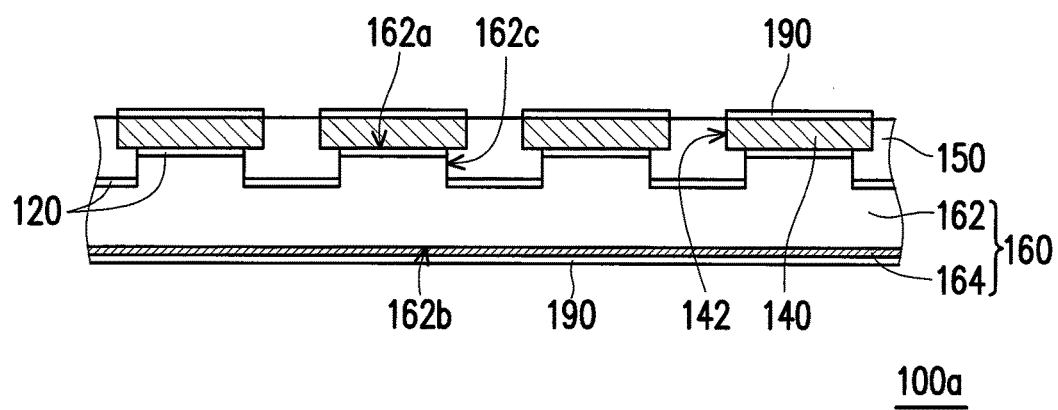
FIG. 2 is a schematic cross-sectional view illustrating a substrate structure according to another embodiment of the invention.

FIG. 2 is a schematic cross-sectional view illustrating a substrate structure according to another embodiment of the invention. Of course, in other embodiments of the invention, the manufacturing process of a substrate structure may be as follows. After the base metal layer 130 is removed, i.e. after the manufacturing step shown in FIG. 1F, the surface finish layer 190 is directly formed on the patterned metal layer 140 and the metal foil 164, as shown in FIG. 2, such that the surface finish layer 190 covers the patterned metal layer 140 and the metal foil 164, thereby forming a substrate structure 100a as shown in FIG. 2. Similarly, the surface finish layer 190 of the present embodiment is an OSP layer, an ENIG layer, an I-Ag layer, an I-Sn layer, an I-Bi layer, a HASL layer, a nickel and gold electroplating layer, an electroless Pd/Ni layer, an electroless Pd/Cu layer, or a Sn—Bi alloy electroplating layer.

In terms of structure, a substrate structure formed by the above manufacturing process includes the dielectric layer 162, the metal foil 164, the patterned metal layer 140 and the first patterned solder-resist layer 150. The dielectric layer 162 includes a first surface 162a and a second surface 162b opposite to the first surface 162a, wherein the first surface 162a has a plurality of recesses 162c. The metal foil 164 is disposed on the second surface 162b, and the patterned metal layer 140 is disposed on the first surface 162a. The patterned metal layer 140 has a plurality of openings 142. The openings 142 respectively correspond to and expose the recesses 162c. The first patterned solder-resist layer 150 is respectively filled into the recesses 162c and the corresponding openings 142. A top surface of the first patterned solder-resist layer 150 is substantially coplanar with a top surface of the patterned metal layer 140.

In addition, in an embodiment of the invention, the substrate structure 100 includes the second patterned solder-resist layer 180 and the surface finish layer 190, as shown in FIG. 1G. The second patterned solder-resist layer 180 is disposed on the first patterned solder-resist layer 150 and the metal foil 164, and covers a portion of the patterned metal layer 140. The surface finish layer 190 covers the portion of the patterned metal layer 140 exposed by the second patterned solder-resist layer 180. In another embodiment of the invention, the second patterned solder-resist layer 180 is not required in the substrate structure 100a, and instead, the surface finish layer 190 directly covers the patterned metal layer 140 and the metal foil 164, as shown in FIG. 2. The surface finish layer 190 is an OSP layer, a Ni/Au layer, a silver layer, a tin layer, a bismuth layer, a Pd/Ni layer, a Pd/Cu layer or a Sn—Bi alloy layer, etc. It is for sure that the invention is not limited thereto.

FIGS. 3A to 3F are schematic cross-sectional views illustrating a process of a manufacturing method of a substrate structure according to another embodiment of the invention. It is to be noted that the manufacturing method of a substrate structure of the present embodiment is roughly similar to that of the aforementioned embodiment. Thus, a part of content of the aforementioned embodiment is also applicable to the present embodiment, and descriptions of the same technical contents will be omitted. For a description of the omitted parts, reference can be found in the aforementioned embodiment, and no repeated description is contained in the present embodiment.

The manufacturing method of a substrate structure of the present embodiment includes the following steps. First, referring to FIG. 3A, a substrate 205 is provided. The substrate 205 of the present embodiment is similar to the substrate 105 of the aforementioned embodiment, and also includes a supporting layer 210, two release layers 220 and two base metal layers 230. The two release layers 220 are disposed on two opposite surfaces of the supporting layer 210 respectively. The two base metal layers 230 cover the two release layers 220 respectively. That is to say, each of the release layers 220 is located between the supporting layer 210 and the corresponding base metal layer 230. The release layer 220, as mentioned in the aforementioned embodiment, is a fluorine release film, a PE release film or a PET release film, etc. It is for sure that the invention is not limited thereto.

Figure 3A:
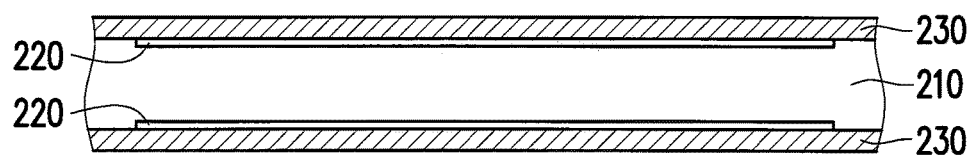
FIGS. 3A to 3F are schematic cross-sectional views illustrating a process of a manufacturing method of a substrate structure according to another embodiment of the invention.
Figure 3B:
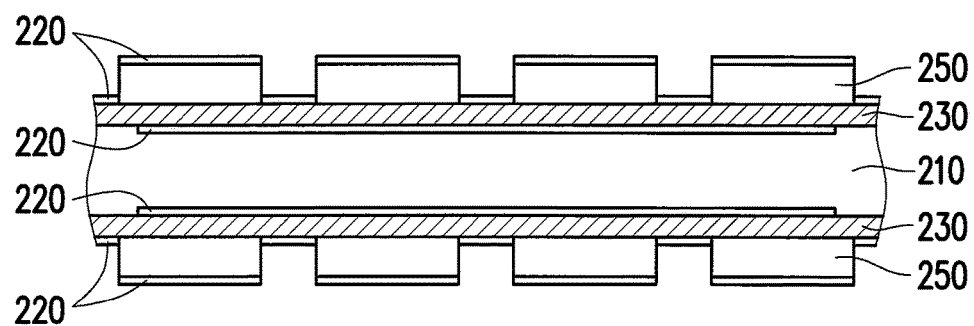
Figure 3C:
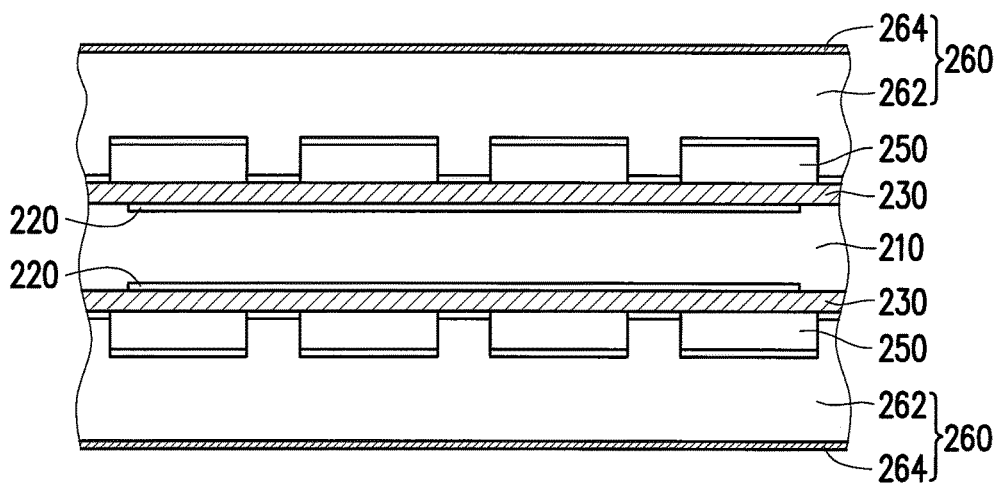

Next, referring to FIG. 3B, a first patterned solder-resist layer 250 is formed on each of the base metal layers 230. Moreover, in the present embodiment, the release layer 220 further covers the base metal layer 230 and the first patterned solder-resist layer 250, such that the base metal layer 230 and the first patterned solder-resist layer 250 may be easily separated from a dielectric layer 262 that is subsequently laminated thereon. Materials of the release layer 220 include polymide (PI), polyethylene terephthalate (PET) or aluminum foil, etc. Then, as shown in FIG. 3C, a stacking layer 260 is laminated on each of the base metal layers 230. Each of the stacking layers 260 covers the corresponding base metal layer 230 and the corresponding first patterned solder-resist layer 250. In detail, as mentioned in the aforementioned embodiment, each of the stacking layers 260 includes the dielectric layer 262 and a metal foil 264. Each of the stacking layers 260 is laminated on the corresponding base metal layer 230 by the dielectric layer 262, and thus, each of the dielectric layers 262 is located between the corresponding base metal layer 230 and the corresponding metal foil 264.

Figure 3D:
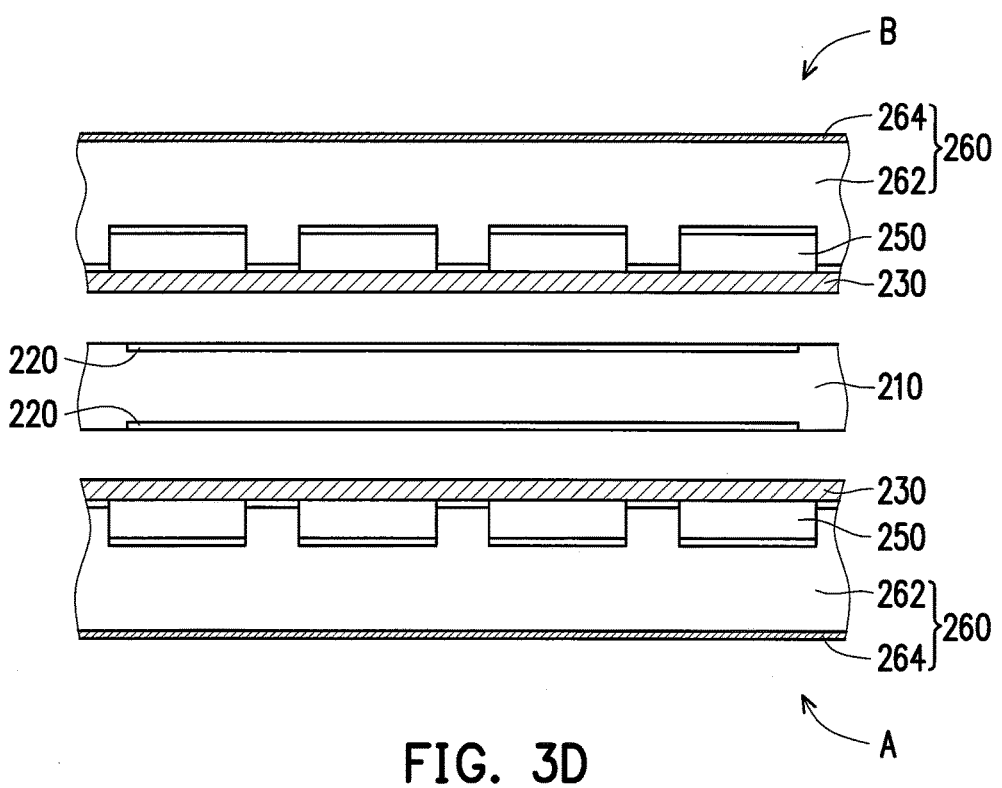
Figure 3E:
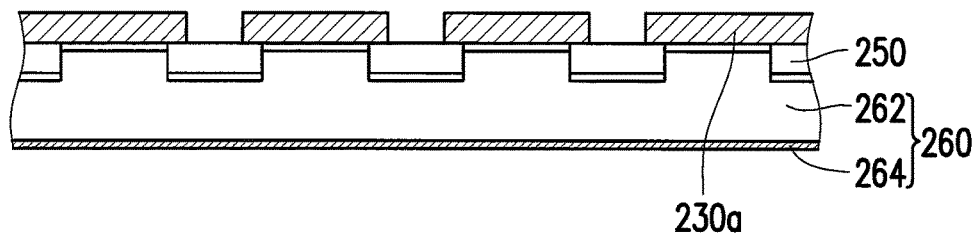

Referring to FIGS. 3C and 3D together, similar to the aforementioned embodiment, by using the separability of the release layer 220, each of the base metal layers 230 is separated from the release layer 220, so as to remove the supporting layer 210 to form the structures A and B that are independent from each other, as shown in FIG. 3D. It is to be noted that in subsequent manufacturing steps, all of FIG. 3D to FIG. 4 only illustrate the independent structure A for exemplary purposes. However, it is understood by persons of ordinary skill in the art that the manufacturing process illustrated in FIG. 3D to FIG. 4 is applicable to both the structures A and B. Next, referring to FIG. 3E, the base metal layer 230 is patterned by, for example, etching process, so as to form a patterned metal layer 230a on the stacking layer 260. The patterned metal layer 230a exposes at least a portion of the first patterned solder-resist layer 250, as shown in FIG. 3E.

Figure 3F:
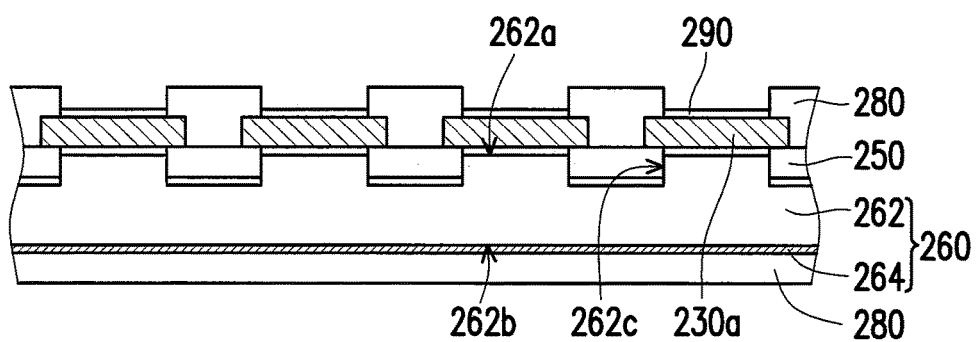
Figure 4:
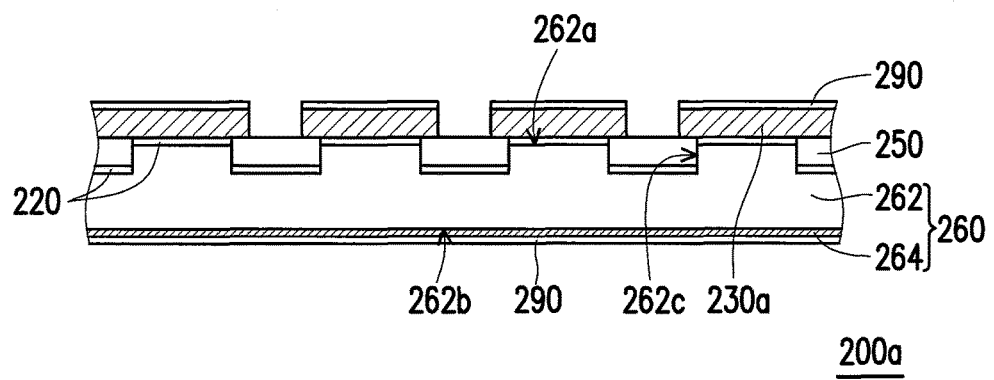
FIG. 4 is a schematic cross-sectional view illustrating a substrate structure according to another embodiment of the invention.

After that, as shown in FIG. 3F, a second patterned solder-resist layer 280 is formed on the exposed first patterned solder-resist layer 250 and the metal foil 264, and the second patterned solder-resist layer 280 covers a portion of the patterned metal layer 230a. Next, a surface finish layer 290 is formed on the patterned metal layer 230a to cover the portion of the patterned metal layer 230a exposed by the second patterned solder-resist layer 280. In this way, the manufacture of a substrate structure 200 can be completed. In the present embodiment, the surface finish layer 290 includes an OSP layer, an ENIG layer, an I-Ag layer, an I-Sn layer, an I-Bi layer, a HASL layer, a nickel and gold electroplating layer, an electroless Pd/Ni layer, an electroless Pd/Cu layer, or a Sn—Bi alloy electroplating layer, etc., as mentioned in the aforementioned embodiment. It is for sure that the invention is not limited thereto.

FIG. 4 is a schematic cross-sectional view illustrating a substrate structure according to another embodiment of the invention. In addition, the manufacturing process of a substrate structure may be as follows. After the base metal layer 230 is patterned to form the patterned metal layer 230a, i.e. after the manufacturing step shown in FIG. 3E, the surface finish layer 290 is directly formed on the patterned metal layer 230a and the metal foil 264, as shown in FIG. 4, such that the surface finish layer 290 covers the patterned metal layer 230a and the metal foil 264, thereby forming a substrate structure 200a as shown in FIG. 4. Similarly, the surface finish layer 290 of the present embodiment is an OSP layer, an ENIG layer, an I-Ag layer, an I-Sn layer, an I-Bi layer, a HASL layer, a nickel and gold electroplating layer, an electroless Pd/Ni layer, an electroless Pd/Cu layer, or a Sn—Bi alloy electroplating layer.

From the above, it is known that a main difference between the manufacturing process of the present embodiment and the aforementioned manufacturing process shown in FIGS. 1A to 2 is as follows. In the aforementioned embodiment, the patterned metal layer 140 is directly formed on the base metal layer 130 by, for example, an additive process, and after a substrate separation is performed (namely, after the supporting layer 110 is removed to form the two independent structures A and B), the base metal layers 130 on the structures A and B are respectively removed, so as to expose the patterned metal layer 140. In the present embodiment, after a substrate separation is performed, the base metal layer 230 is directly subjected to a subtractive process, such as etching, so as to form the patterned metal layer 230a. Therefore, persons of ordinary skill in the art may select a suitable manufacturing method according to actual manufacturing requirements. For example, if there is a demand for fine-pitch circuits, it may be considered to use the manufacturing process shown in FIGS. 1A to 2 for forming the substrate structures 100 and 100a of the invention; if production efficiency or cost has to be taken into account, it may be considered to use the manufacturing process shown in FIGS. 3A to 4, which involves simpler steps, for forming the substrate structures 200 and 200a of the invention. Of course, the invention is not intended to limit the application scope of the above manufacturing method.

In terms of structure, a substrate structure formed by the above manufacturing process includes the dielectric layer 262, the metal foil 264, the first patterned solder-resist layer 250 and the patterned metal layer 230a. The dielectric layer 262 includes a first surface 262a and a second surface 262b opposite to the first surface 262a. The first surface 262a has a plurality of recesses 262c. The metal foil 264 is disposed on the second surface 262b. The first patterned solder-resist layer 250 is filled into each of the recesses 262c, and a top surface of the first patterned solder-resist layer 250 is substantially coplanar with the first surface 262a. The patterned metal layer 230a is disposed on the first surface 262a and exposes at least a portion of the first patterned solder-resist layer 250.

In addition, in an embodiment of the invention, the substrate structure 200 includes the second patterned solder-resist layer 280 and the surface finish layer 290, as shown in FIG. 3F. The second patterned solder-resist layer 280 is disposed on the first patterned solder-resist layer 250 and the metal foil 264, and covers a portion of the patterned metal layer 230a. The surface finish layer 290 covers the portion of the patterned metal layer 230a exposed by the second patterned solder-resist layer 280. In another embodiment of the invention, the second patterned solder-resist layer 280 is not required in the substrate structure 200a, and instead, the surface finish layer 290 directly covers the patterned metal layer 230a and the metal foil 264, as shown in FIG. 4. The surface finish layer 290 is an OSP layer, a Ni/Au layer, a silver layer, a tin layer, a bismuth layer, a Pd/Ni layer, a Pd/Cu layer or a Sn—Bi alloy layer, etc. It is for sure that the invention is not limited thereto.

In summary, for the substrate structure of the invention, the manufacturing processes of the substrate structure are respectively performed on a separable substrate in a symmetrical manner. Accordingly, after a substrate separation is performed, two substrate structures independent from each other may be obtained simultaneously, so as to effectively save the manufacturing time and improve the production efficiency. In addition, in the substrate of the invention, the release layer is connected between the supporting layer and the patterned metal layer, such that after the stacking layer is formed, the supporting layer can be easily removed by taking advantage of the separability of the release layer. Therefore, compared to a conventional substrate structure which is formed by stacking a plurality of stacking layers on a core layer, the substrate structure of the invention has a smaller overall thickness, and thus a package structure using such substrate structure can has a smaller package thickness.

In addition, the invention further provides two manufacturing methods of a substrate structure, in which patterned circuit layers can be formed by additive and subtractive methods. Accordingly, the user may select a suitable substrate structure and manufacturing method thereof according to actual requirements of manufacturing process or product. Hence, the invention does increase flexibility in design and manufacture of the substrate structure.

Although the invention has been described with reference to the above embodiments, it will be apparent to persons of ordinary skill in the art that modifications to the described embodiments may be made without departing from the spirit of the invention. Accordingly, the scope of the invention will be defined by the attached claims and not by the above detailed descriptions.

What is claimed is:

1. A substrate structure, comprising:
   a dielectric layer comprising a first surface and a second surface opposite to the first surface, the first surface having a plurality of recesses;
   a metal foil disposed on the second surface;
   a patterned metal layer disposed on the first surface, the patterned metal layer having a plurality of openings, the openings respectively corresponding to and exposing the recesses;
   a first patterned solder-resist layer filled in each of the recesses and corresponding to each of the openings, a top surface of the first patterned solder-resist layer being substantially coplanar with a top surface of the patterned metal layer;

a release layer disposed between the first patterned solder-resist layer and the dielectric layer and between the patterned metal layer and the dielectric layer; and a second patterned solder-resist layer disposed on the first patterned solder-resist layer and in the openings of the patterned metal layer, and covering a portion of the patterned metal layer.

2. The substrate structure as claimed in claim 1, further comprising:

a surface finish layer covering the exposed portion of the patterned metal layer.

3. The substrate structure as claimed in claim 2, wherein the surface finish layer comprises an OSP layer, a Ni/Au layer, a silver layer, a tin layer, a bismuth layer, a Pd/Ni layer, a Pd/Cu layer or a Sn—Bi alloy layer.

4. The substrate structure as claimed in claim 1, further comprising:

a surface finish layer covering the patterned metal layer and the metal foil.

5. The substrate structure as claimed in claim 4, wherein the surface finish layer comprises an OSP layer, a Ni/Au layer, a silver layer, a tin layer, a bismuth layer, a Pd/Ni layer, a Pd/Cu layer or a Sn—Bi alloy layer.

6. The substrate structure as claimed in claim 1, wherein the release layer comprises a fluorine release film, a PE release film, or a PET release film.

7. The substrate structure as claimed in claim 1, wherein a material of the release layer comprises polymide (PI), polyethylene terephthalate (PET) or aluminum foil.

* * * * *